United States Patent
Wang et al.

(10) Patent No.: US 9,831,302 B2
(45) Date of Patent: Nov. 28, 2017

(54) MAKING ELECTRICAL COMPONENTS IN HANDLE WAFERS OF INTEGRATED CIRCUIT PACKAGES

(71) Applicant: Invensas Corporation, San Jose, CA (US)

(72) Inventors: Liang Wang, Milpitas, CA (US); Hong Shen, Palo Alto, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/360,121

(22) Filed: Nov. 23, 2016

(65) Prior Publication Data
US 2017/0077076 A1   Mar. 16, 2017

Related U.S. Application Data

(63) Continuation of application No. 14/833,979, filed on Aug. 24, 2015, now Pat. No. 9,508,638, which is a
(Continued)

(51) Int. Cl.
*H01L 21/02* (2006.01)
*H01L 49/02* (2006.01)
(Continued)

(52) U.S. Cl.
CPC ............ *H01L 28/60* (2013.01); *H01L 21/56* (2013.01); *H01L 23/49838* (2013.01);
(Continued)

(58) Field of Classification Search
CPC ......................... H01L 28/60; H01L 23/5223
See application file for complete search history.

(56) References Cited

U.S. PATENT DOCUMENTS

| 5,532,519 A | 7/1996 | Bertin et al. |
| 5,701,233 A | 12/1997 | Carson et al. |

(Continued)

FOREIGN PATENT DOCUMENTS

| EP | 1418617 A2 | 5/2004 |
| EP | 1884994 A2 | 6/2008 |

(Continued)

OTHER PUBLICATIONS

John H. Lau, "TSV Interposer: The most Cost-Effective Integrator for 30 IC Integration," Electronics & Optoelectronics Research Laboratories, Industrial Technology Research Institute (ITRI), retrieved on Feb. 24, 2015.

(Continued)

*Primary Examiner* — Bradley K Smith
(74) *Attorney, Agent, or Firm* — Haynes and Boone, LLP

(57) ABSTRACT

A method for making an integrated circuit package includes providing a handle wafer having a first region defining a cavity. A capacitor is formed in the first region. The capacitor has a pair of electrodes, each coupled to one of a pair of conductive pads, at least one of which is disposed on a lower surface of the handle wafer. An interposer having an upper surface with a conductive pad and at least one semiconductor die disposed thereon is also provided. The die has an integrated circuit that is electroconductively coupled to a redistribution layer (RDL) of the interposer. The lower surface of the handle wafer is bonded to the upper surface of the interposer such that the die is disposed below or within the cavity and the electroconductive pad of the handle wafer is bonded to the electroconductive pad of the interposer in a metal-to-metal bond.

20 Claims, 2 Drawing Sheets

Related U.S. Application Data continuation of application No. 14/268,899, filed on May 2, 2014, now Pat. No. 9,165,793.

(51) Int. Cl.

| | | |
|---|---|---|
| *H01L 21/56* | (2006.01) | |
| *H01L 23/00* | (2006.01) | |
| *H01L 25/10* | (2006.01) | |
| *H01L 25/11* | (2006.01) | |
| *H01L 25/16* | (2006.01) | |
| *H01L 25/00* | (2006.01) | |
| *H01L 23/498* | (2006.01) | |
| *H01L 23/522* | (2006.01) | |

(52) U.S. Cl.
CPC .......... *H01L 23/5223* (2013.01); *H01L 24/32* (2013.01); *H01L 24/83* (2013.01); *H01L 25/105* (2013.01); *H01L 25/11* (2013.01); *H01L 25/115* (2013.01); *H01L 25/165* (2013.01); *H01L 25/50* (2013.01); *H01L 28/40* (2013.01); *H01L 28/65* (2013.01); *H01L 2224/16225* (2013.01); *H01L 2224/32225* (2013.01); *H01L 2224/73204* (2013.01); *H01L 2924/15311* (2013.01); *H01L 2924/16153* (2013.01)

(56) References Cited

U.S. PATENT DOCUMENTS

| | | |
|---|---|---|
| 6,008,536 A | 12/1999 | Mertol |
| 6,157,076 A | 12/2000 | Azotea et al. |
| 6,222,722 B1 | 4/2001 | Fukuzumi et al. |
| 6,251,796 B1 | 6/2001 | Ha et al. |
| 6,322,903 B1 | 11/2001 | Siniaguine et al. |
| 6,384,473 B1 | 5/2002 | Peterson et al. |
| 6,403,444 B2 | 6/2002 | Fukuzumi et al. |
| 6,451,650 B1 | 9/2002 | Lou |
| 6,492,726 B1 | 12/2002 | Quek et al. |
| 6,613,672 B1 | 9/2003 | Wang et al. |
| 6,620,701 B2 | 9/2003 | Ninq |
| 6,624,505 B2 | 9/2003 | Badehl |
| 6,717,254 B2 | 4/2004 | Siniaguine |
| 6,746,876 B2 | 6/2004 | Itoh et al. |
| 6,787,916 B2 | 9/2004 | Halahan |
| 6,947,275 B1 | 9/2005 | Anderson et al. |
| 6,958,285 B2 | 10/2005 | Siniaguine |
| 7,011,988 B2 | 3/2006 | Forcier |
| 7,049,170 B2 | 5/2006 | Savastiouk et al. |
| 7,061,102 B2 | 6/2006 | Eghan et al. |
| 7,115,988 B1 | 10/2006 | Hool |
| 7,144,745 B2 | 12/2006 | Badehi |
| 7,183,643 B2 | 2/2007 | Gibson et al. |
| 7,186,586 B2 | 3/2007 | Savastiouk et al. |
| 7,400,036 B2 | 7/2008 | Tan |
| 7,670,921 B2 | 3/2010 | Chinthakindi et al. |
| 7,786,591 B2 | 8/2010 | Khan et al. |
| 7,863,096 B2 | 1/2011 | England |
| 7,906,803 B2 | 3/2011 | Shiova et al. |
| 7,928,548 B2 | 4/2011 | Bernstein et al. |
| 7,964,508 B2 | 6/2011 | Savastiouk et al. |
| 7,977,579 B2 | 7/2011 | Bathan et al. |
| 7,989,270 B2 | 8/2011 | Huang et al. |
| 8,018,068 B1 | 9/2011 | Scanlan et al. |
| 8,071,470 B2 | 12/2011 | Khor et al. |
| 8,072,082 B2 | 12/2011 | Yean et al. |
| 8,076,788 B2 | 12/2011 | Haba et al. |
| 8,102,039 B2 | 1/2012 | Noma et al. |
| 8,110,862 B2 | 2/2012 | Cheng et al. |
| 8,183,696 B2 | 5/2012 | Meyer et al. |
| 8,257,985 B2 | 9/2012 | Stevenson et al. |
| 8,377,829 B2 | 2/2013 | Yeh et al. |
| 8,378,480 B2 | 2/2013 | Cheng et al. |
| 8,397,013 B1 | 3/2013 | Rosenband et al. |
| 8,426,961 B2 | 4/2013 | Shih et al. |
| 8,470,668 B2 | 6/2013 | Cho et al. |
| 8,518,753 B2 | 8/2013 | Wu et al. |
| 8,519,537 B2 | 8/2013 | Jenq et al. |
| 8,525,318 B1 | 9/2013 | Kim et al. |
| 8,575,493 B1 | 11/2013 | Xu et al. |
| 8,598,695 B2 | 12/2013 | Oganesian et al. |
| 8,629,546 B1 | 1/2014 | Scanlan et al. |
| 8,674,423 B2 | 3/2014 | Collins et al. |
| 8,830,689 B2 | 9/2014 | Kim et al. |
| 9,165,793 B1 | 10/2015 | Wang et al. |
| 9,252,127 B1 | 2/2016 | Shen et al. |
| 2004/0134796 A1 | 7/2004 | Shelp et al. |
| 2004/0174682 A1 | 9/2004 | Lin et al. |
| 2004/0178495 A1 | 9/2004 | Yean |
| 2004/0183187 A1 | 9/2004 | Yamasaki et al. |
| 2004/0201111 A1 | 10/2004 | Thurgood |
| 2004/0238934 A1 | 12/2004 | Warner et al. |
| 2005/0046002 A1 | 3/2005 | Lee et al. |
| 2005/0047094 A1 | 3/2005 | Hsu |
| 2005/0068739 A1 | 3/2005 | Arvelo et al. |
| 2005/0196095 A1 | 9/2005 | Karashima et al. |
| 2005/0263869 A1 | 12/2005 | Tanaka et al. |
| 2005/0266701 A1 | 12/2005 | Aoyagi |
| 2007/0029654 A1 | 2/2007 | Sunohara et al. |
| 2007/0045798 A1 | 3/2007 | Horie |
| 2007/0197013 A1 | 8/2007 | Trezza |
| 2007/0221399 A1 | 9/2007 | Nishizawa et al. |
| 2007/0235850 A1 | 10/2007 | Gerber et al. |
| 2008/0128897 A1 | 6/2008 | Chao |
| 2008/0244902 A1 | 10/2008 | Blackwell |
| 2008/0280394 A1 | 11/2008 | Murtuza et al. |
| 2009/0008762 A1 | 1/2009 | Jung et al. |
| 2009/0115047 A1 | 5/2009 | Haba et al. |
| 2009/0212407 A1 | 8/2009 | Foster et al. |
| 2009/0267238 A1 | 10/2009 | Joseph et al. |
| 2010/0025081 A1 | 2/2010 | Arai et al. |
| 2010/0081236 A1 | 4/2010 | Yang et al. |
| 2010/0084761 A1 | 4/2010 | Shinaqawa |
| 2010/0134991 A1 | 6/2010 | Kim et al. |
| 2010/0144101 A1 | 6/2010 | Chow et al. |
| 2010/0224980 A1 | 9/2010 | Chahal |
| 2010/0230797 A1 | 9/2010 | Honda |
| 2010/0230806 A1 | 9/2010 | Huang et al. |
| 2010/0276799 A1 | 11/2010 | Heng et al. |
| 2011/0027967 A1 | 2/2011 | Beyne et al. |
| 2011/0068444 A1 | 3/2011 | Chi et al. |
| 2011/0068468 A1 | 3/2011 | Lin et al. |
| 2011/0080713 A1 | 4/2011 | Sunohara |
| 2011/0095403 A1 | 4/2011 | Lee |
| 2011/0101349 A1 | 5/2011 | Oda |
| 2011/0221072 A1 | 9/2011 | Chin |
| 2011/0287606 A1 | 11/2011 | Brun et al. |
| 2011/0300668 A1 | 12/2011 | Parvarandeh |
| 2011/0304036 A1 | 12/2011 | Son |
| 2012/0001339 A1 | 1/2012 | Malatkar |
| 2012/0020026 A1 | 1/2012 | Oganesian |
| 2012/0049332 A1 | 3/2012 | Chen et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0101540 A1 | 4/2012 | O'Brien et al. |
| 2012/0106228 A1 | 5/2012 | Lee |
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319300 A1 | 12/2012 | Kim |
| 2013/0010441 A1 | 1/2013 | Oganesian et al. |
| 2013/0014978 A1 | 1/2013 | Uzoh et al. |
| 2013/0032390 A1 | 2/2013 | Hu et al. |
| 2013/0069239 A1 | 3/2013 | Kim et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0099368 A1 | 4/2013 | Han |
| 2013/0119527 A1 | 5/2013 | Luo et al. |
| 2013/0119528 A1 | 5/2013 | Groothuis et al. |
| 2013/0146991 A1 | 6/2013 | Otremba et al. |

(56) References Cited

U.S. PATENT DOCUMENTS

| | | | |
|---|---|---|---|
| 2013/0181354 A1 | 7/2013 | Khan et al. | |
| 2013/0187292 A1 | 7/2013 | Semmelmeyer et al. | |
| 2013/0228898 A1 | 9/2013 | Ide | |
| 2013/0241026 A1 | 9/2013 | Or-Bach et al. | |
| 2013/0267046 A1 | 10/2013 | Or-Bach et al. | |
| 2013/0270660 A1 | 10/2013 | Bryzek et al. | |
| 2013/0292840 A1 | 11/2013 | Shoemaker et al. | |
| 2013/0313680 A1 | 11/2013 | Oqanesian et al. | |
| 2014/0036454 A1 | 2/2014 | Caskey et al. | |
| 2014/0070380 A1 | 3/2014 | Chiu et al. | |
| 2014/0091461 A1 | 4/2014 | Shen | |
| 2014/0134796 A1 | 5/2014 | Kelly et al. | |
| 2014/0134803 A1 | 5/2014 | Kelly et al. | |
| 2014/0134804 A1 | 5/2014 | Kelly | |
| 2014/0225244 A1 | 8/2014 | Smith et al. | |
| 2014/0246227 A1 | 9/2014 | Lin et al. | |
| 2014/0252655 A1 | 9/2014 | Tran | |
| 2014/0264811 A1 | 9/2014 | Wu | |
| 2014/0319683 A1 | 10/2014 | Lin et al. | |
| 2014/0361410 A1 | 12/2014 | Yamamichi et al. | |
| 2015/0001731 A1 | 1/2015 | Shuto | |
| 2015/0021755 A1 | 1/2015 | Hsiao et al. | |
| 2015/0262902 A1* | 9/2015 | Shen | H01L 23/315 438/107 |
| 2015/0262928 A1 | 9/2015 | Shen et al. | |
| 2015/0262972 A1* | 9/2015 | Katkar | H01L 21/561 257/48 |
| 2015/0333049 A1 | 11/2015 | Woychik | |
| 2016/0079214 A1 | 3/2016 | Caskey | |

FOREIGN PATENT DOCUMENTS

| | | | |
|---|---|---|---|
| EP | 1688994 B1 | 8/2008 | |
| EP | 2546876 A1 | 1/2013 | |
| EP | 2555239 A2 | 2/2013 | |
| WO | 2005/022630 A1 | 3/2005 | |
| WO | WO 2005/022630 A1 | 3/2005 | |
| WO | 2006/124597 A2 | 11/2006 | |
| WO | WO 2006/124597 A2 | 11/2006 | |
| WO | 2007/142721 A1 | 12/2007 | |
| WO | WO 2007/142721 A1 | 12/2007 | |
| WO | 2009/070348 A1 | 6/2009 | |
| WO | WO 2009/070348 A1 | 6/2009 | |
| WO | 2012/167162 A1 | 12/2012 | |
| WO | WO 2012/169162 A1 | 12/2012 | |
| WO | 2013/062533 A1 | 5/2013 | |
| WO | WO 2013/062533 A1 | 5/2013 | |

OTHER PUBLICATIONS

Chipscale Review, "The Impact of CSPs on Encapsulation Materials," ChipScale Review publication issue Mar. 1998, retrieved Feb. 21, 2014, 6 pages.

Dr. Paul A. Magill, "A New Thermal-Management Paradigm for Power Devices," Power Electronics Technology, Nov. 2008, pp. 26-30.

Herming Chiu EH et al., "A Dynamic Thermal Management Circuit for System-on-Chip Designs," Analog Integrated Circuits and Signal Processing, 36, pp. 175-181, Jan. 25, 2003.

Hybrid Memory Cube Consortium, "Hybrid Memory Cube Specification 1.0," Last Revision Jan. 2013, 122 pages, Retrieved from: http://hybridmemorycube.org/specificationdownload/.

K. Zoschke et al., "Hermetic Wafer Level Packaging of MEMS Components Using Through Silicon via and Wafer to Wafer Bonding Technologies" (2013 Electronic Components & Technology Conference, IEEE, pp. 1500-1507).

Lau et al., "Thin-Wafer Handling with a Heat-Spreader Wafer for 2.5D/3D IC Integration," 46th International Symposium on Microelectronics (IMAPS 2013) Sep. 30-Oct. 3, 2013, Orlando, FL USA, pp. 1-8 [389-396].

Li Shang et al., "Thermal Crisis: Challenges and Potential Solutions," Potentials, vol. 25, Issue 5, Sep./Oct. 2006, pp. 31-35.

Nakamura et al., "Technology Trends and Future History of Semiconductor Packaging Substrate Material," Hitachi Chemical Review Technical Report No. 55, May 2013, pp. 24-29.

Pulliam, Wayne, "Designing with BGAs," AMO presentation, 2008, 62 pages.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

U.S. Appl. No. 14/201,585, filed Mar. 7, 2014.

U.S. Appl. No. 14/214,365 titled, "Integrated Circuits Protected by Substrates with Cavities, and Methods of Manufacture," filed Mar. 14, 2014, 40 pages.

Dreiza; Moody et al., "Joint Project for Mechanical Qualification of Next Generation High Density Package-on-Package (PoP) with Through Mold via Technology," Amkor Technology, EMPC2009— 17th European Microelectronics & Packaging Conference, Jun. 16, Rimini, Italy, 8 pages.

Zwenger; Curtis et al., "Next Generation Package-on_Package (PoP) Platform with Through Mold via (TMV™) Interconnection Technology," Amkor Technology, Originally published in the proceedings of the IMPAS Device Packaging Conference, Scottsdale, AZ, Mar. 10-12, 2009, 8 pages.

Kim; Jinseong et al., "Application of Through Mold via (TMV) as PoP base package," Amkor Technology, 2008 IEEE Reprinted from ECTC2008 Proceedings, 6 pages.

U.S. Appl. No. 14/250,317 titled "Die Stacks With One or More Bond via Arrays," filed Apr. 10, 2014, 58 pages.

Das; Rabindra N. et al., "Package-Interpose-Package (PIP) Technology for High End Electronics," Endicott Interconnect Technologies, Inc., retrieved Jul. 31, 2014, 4 pages.

McCormick; Heather et al., "Ass Embly and Reliability Assessment of Fine Pitch TMV Package on Package (PoP) Components, "Amkor Technology Inc., Originally published in the Proceedings of the SMTA International Conference, San Diego, CA, Oct. 4-8, 2009, 8 pages.

U.S. Appl. No. 14/288,064 titled, "Integrated Circuit Assemblies With Reinforcement Frames, and Methods of Manufacture," filed May 27, 2014.

U.S. Appl. No. 14/328,380 titled, "Microelectronic Assemblies With Integrated Circuits and Interposers With Cavities, and Methods of Manufacture," filed Jul. 10, 2014.

International Search Report and Written Opinion, dated May 12, 2015, 11 pages, PCT Patent Application No. PCT/US2015/019609.

International Search Report and Written Opinion, dated Aug. 6, 2015, 1 O pages, PCT Patent Application No. PCT/US2015/028172.

Turner et al., "Mechanics of direct wafer bonding", 2006, pp. 171-188, vol. 462, doi: 10.1098/rspa.2005.1571, Proceedings of the Royal Society A, London, United Kinqdom.

U.S. First Action Interview Pilot Program Pre-Interview Communication, dated Oct. 22, 2014, for U.S. Appl. No. 14/214,365, filed Mar. 14, 2014.

Strandjord et al., "Bumping for WLCSP using Solder Ball Attach on electrolessss NiAu UBM", 2008, 29 pages, Pac Tech USA— Packaging Technologies, Inc., Santa Clara, California.

Boyle et al., "Epoxy Resins", 2001, pp. 78-89, vol. 21, ASM Handbook, Composites (ASM International).

U.S. Patent Application, "Interposers With Circuit Modules Encapsulated by Moldable Material in a Cavity, and Methods of Fabrication", filed Dec. 2, 2014, U.S. Appl. No. 14/558,462, 19 pages.

Pre-Interview First Office Action dated Oct. 22, 2014 of U.S. Appl. No. 14/214,365.

Final Office Action dated Mar. 2, 2015 of U.S. Appl. No. 14/214,365.

Notice of Allowance dated Apr. 16, 2015 of U.S. Appl. No. 14/268,899.

U.S. Appl. No. 14/268,899 titled, "Making Electrical Components in Handle Wafers of Integrated Circuit Packages," filed May 2, 2014.

U.S. Appl. No. 14/558,462 titled, "Interpose RS With Circuit Modules Encapsulated by Moldable Material in a Cavity, and Methods of Fabrication," filed Dec. 2, 2014.

Office Action dated Jul. 9, 2015 for U.S. Appl. No. 14/558,462, 11 pages.

(56) References Cited

OTHER PUBLICATIONS

International Search Report and Written Opinion for PCT/US2015/032572 dated Nov. 23, 2015.
International Search Report dated Sep. 21, 2015 for International Application No. PCT/US2015/033786, International Filing Date Feb. 6, 2015.
U.S. Appl. No. 14/745,237 titled, "Microelectronic Assemblies With Cavities, and Methods of Fabrication," filed May 19, 2015.
International Search Report and Written Opinion in PCT/US2015/063128, dated Feb. 18, 2016.
Zwenger; Curtis et al., "Next Generation Package-on_Package (PoP) Platform with Through Mold via (TMV™) Interconnection Technology," Amkor Technology, Originally published in the proceedings of the IMPAS Device Packaging Conference, Scottsdale, AZ, Mar. 10-12, 2009, pages.
International Search Report and Written Opinion, dated May 12, 2015, 11 pages, PCT Patent Application No. PCTUS2015/019609.
Turner et al., "Mechanics of direct wafer bonding", 2006, pp. 171-188, vol. 462, doi: 10.1098/rspa.2005.1571, Proceedings of the Royal Society A, London, United Kingdom.
International Search Report and Written Opinion for PCT/US2015/032572 dated Nov. 23, 2015.

\* cited by examiner

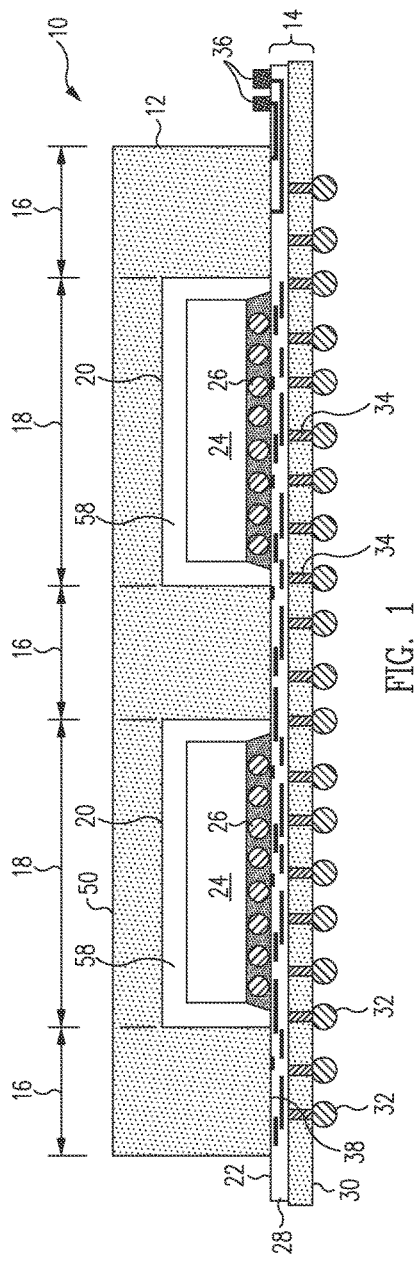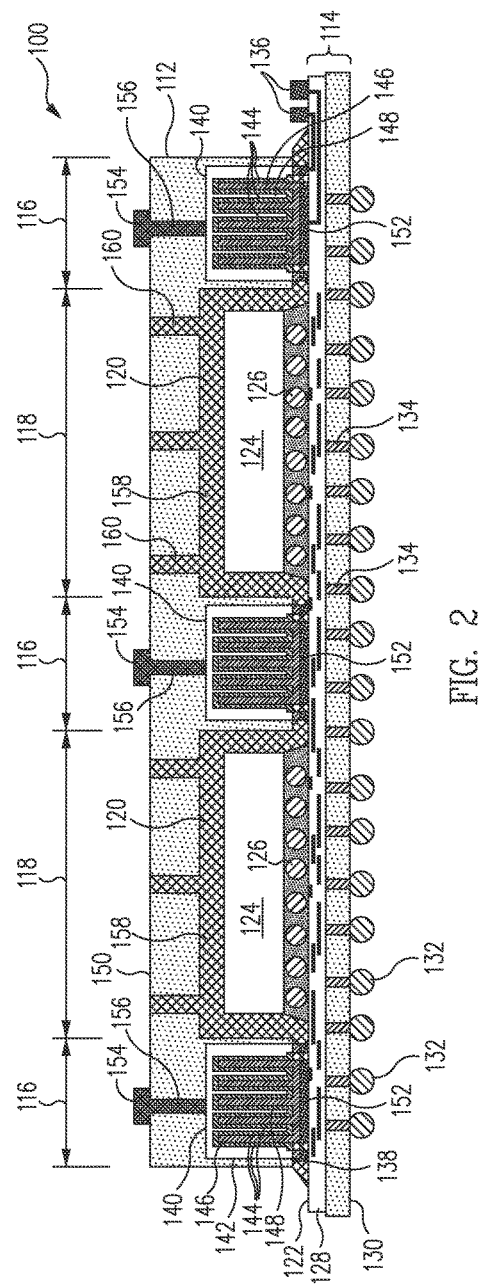

MAKING ELECTRICAL COMPONENTS IN HANDLE WAFERS OF INTEGRATED CIRCUIT PACKAGES

CROSS-REFERENCE TO RELATED APPLICATIONS

This application is a continuation of U.S. patent application Ser. No. 14/833,979, filed Aug. 24, 2015, the disclosure of which is incorporated herein by reference, which is a continuation of U.S. patent application Ser. No. 14/268,899, filed May 2, 2014 (now U.S. Pat. No. 9,165,793), the disclosure of which is hereby incorporated by reference.

BACKGROUND

1. Technical Field:

This disclosure generally relates to making integrated circuit packages with "handle wafers," and more particularly, to making discrete electrical components, such as capacitors, within the handle wafers of such packages.

2. Related Art:

The "wafer level" or "wafer scale" production of integrated circuit (IC) packages has proliferated in recent years, due primarily to the economies of scale that such production techniques afford, together with the concomitant reduction in size and cost of the resulting packages.

Examples of such IC packages and methods for making them can be found in, e.g., commonly owned U.S. patent application Ser. No. 14/214,365 by H. Shen, et al., filed Mar. 14, 2014, and entitled "Integrated Circuits Protected by Substrates with Cavities, and Methods of Manufacture," the entire disclosure of which is incorporated herein by reference.

In one of only many possible embodiments of such packages, the packages, which are cut, or "singulated" from a sandwich of two wafers containing a number of similar packages, can include a portion of a wiring substrate wafer, sometimes referred to as an "interposer wafer," having an upper surface upon which are disposed one or more semiconductor dies or chips (which may be packaged or unpackaged), each containing one or more integrated circuits (ICs). The interposer can contain a pattern of electroconductive traces, e.g., in the form of a "redistribution layer" (RDL), to which the ICs are variously electroconductively connected. The interposer can also contain discrete electrical components, such as "trench capacitors," that are formed either on its surface or within its thickness.

The IC package can further include a portion of a "handle wafer" that contains one or more cavities in its lower surface. The lower surface of the handle wafer can be bonded to the upper surface of the interposer such that the semiconductor dies are disposed protectively within the cavities of the handle wafer. The handle wafer thus provides not only a protective environment for the dies, but also a convenient mechanism for "handling" interposer wafers that are relatively thin, say, on the order of about $5 \times 10^{-6}$ meters (5 μm) thick, or for holding interposer wafers during a thinning operation, e.g., by chemical mechanical planarization (CMP).

However, a practical problem arises when the interposer wafer of such packages is made substantially thin, in that this limits the vertical height of the discrete electrical components, such as capacitors, that can be built into the thickness of the interposer, and hence, their maximum surface area or capacitance.

Accordingly, a long felt but as yet unsatisfied need exists for methods and apparatus that overcome the foregoing and other problems of the prior art.

SUMMARY

In accordance with embodiments of the present invention, methods are provided for fabricating discrete electrical components, viz., capacitors, within a first substrate, e.g., a handle wafer, of an integrated circuit (IC) package, which also contains cavities for housing integrated circuit dies or packages mounted on an associated second substrate, for example, an interposer wafer. The novel methods enable the efficient use of volume, and hence, a reduction in size of semiconductor packages and a maximization of the size and capacity, e.g., capacitance, of the discrete components.

In one embodiment, a method for making an integrated circuit package comprises providing a handle wafer having a first region and a second region, the first region at least partially defining a cavity within the handle wafer, the cavity defining the second region. A capacitor is formed in the first region of the handle wafer. The capacitor has a pair of electrodes, each of which is electroconductively coupled to a corresponding one of a pair of electroconductive pads. At least one of these pads is disposed on a lower surface of the handle wafer in the first region thereof. An interposer is also provided. The interposer has an upper surface with an electroconductive pad and a semiconductor die disposed thereon. The semiconductor die has an integrated circuit (IC) formed therein, which is electroconductively coupled to a redistribution layer (RDL) disposed on or within the interposer. The lower surface of the handle wafer is bonded to the upper surface of the interposer such that the semiconductor die is disposed below or within the cavity, and the electroconductive pad of the handle wafer is electroconductively bonded to the electroconductive pad of the interposer in a metal-to-metal bond.

In another embodiment, an integrated circuit package comprises a first substrate having a first region and a second region, the first region at least partially defining a cavity within the substrate, the cavity defining a second region. A capacitor is disposed in the first region of the first substrate. The capacitor comprises a layer of a dielectric sandwiched between two electroconductive plates. Each of the two conductive plates is electroconductively coupled to a corresponding one of a pair of electroconductive pads, at least one of which is disposed on the lower surface of the first substrate in the first region thereof. A second substrate having an upper surface with an electroconductive pad and a semiconductor die disposed thereon is provided. The semiconductor die has an integrated circuit formed therein, which is electroconductively coupled to a redistribution layer (RDL) disposed on or within the second substrate. The lower surface of the first substrate is bonded to the upper surface of the second substrate such that the semiconductor die is disposed below or within the cavity, and the electroconductive pad of the first substrate is electroconductively bonded to the electroconductive pad of the second substrate in a metal-to-metal bond.

In yet another embodiment, the second substrate can further include at least one capacitor disposed below an upper surface thereof, the capacitor having a pair of electroconductive plates electroconductively coupled to corresponding ones of a pair of electroconductive pads, at least one of which comprises the at least one electroconductive pad disposed on the upper surface of the second substrate, such that one of the pair of electroconductive plates of the capacitor of the first substrate is electrically coupled to one of the pair of electroconductive plates of the capacitor of the second substrate, and the capacitor of the first substrate is disposed above and in a stacked alignment with the capacitor of the second substrate.

The scope of this invention is defined by the claims appended hereafter, which are incorporated into this section by reference. A more complete understanding of the features and advantages of the novel methods and apparatus for fabricating electrical components within the handle wafers of IC packages will be afforded to those of some skill in the art by a consideration of the detailed description of some example embodiments thereof presented below, especially if such consideration is made in conjunction with the appended drawings briefly described below, wherein like reference numerals are used to identify like elements illustrated in one or more of the respective figures thereof.

BRIEF DESCRIPTION OF THE SEVERAL VIEWS OF THE DRAWINGS

FIG. 1 is a vertical cross-sectional view of an example embodiment of an integrated circuit package of a type to which the methods and apparatus of the present invention can be advantageously applied;

FIG. 2 is a vertical cross-sectional view of an example embodiment of an integrated circuit package in accordance with the present invention;

DETAILED DESCRIPTION

Figure 4:
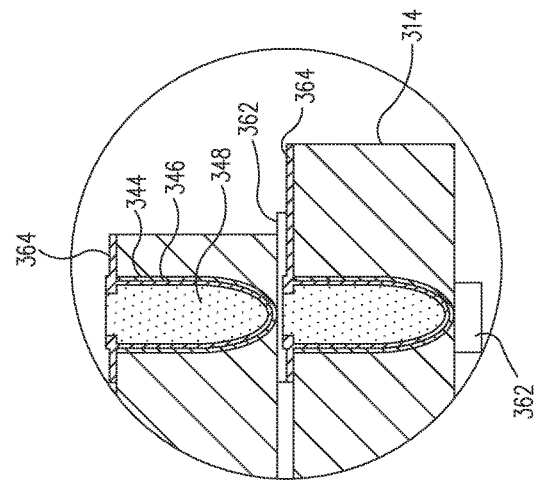

This disclosure provides embodiments of methods for making semiconductor packages in which electrical components, viz., metal-insulator-metal (MIM) capacitors, are fabricated within selected regions of a first substrate, such as a handle wafer, that contains cavities for housing integrated circuit dies or packages mounted on a second, associated substrate, e.g., an interposer wafer. The methods result in a more efficient use of package volume, and hence, semiconductor packages of a reduced size and/or enhanced functionality.

FIG. 1 is a vertical cross-sectional view of an example embodiment of an IC package 10 of a type disclosed in commonly owned U.S. patent application Ser. No. 14/214,365 above, and to which the methods and apparatus of the present invention can be advantageously applied. As discussed above, the package 10 comprises a "sandwich" of a first substrate, or "handle wafer" 12, and a second substrate, or "interposer" 14. The handle wafer 12 includes at least one "first region" 16 and at least one "second region" 18. The first regions 14 at least partially define cavities 20 within the handle wafer 12, and the cavities 20 define the second regions 18. In the particular example IC package 10 of FIG. 1, the handle wafer 12 includes at least three first regions 16, two second regions 18 and two corresponding cavities 20. However, it should be understood that the handle wafer 12 can include any practical number of first regions 16 and associated second regions 18 and cavities 20.

In the particular example IC package 10 of FIG. 1, the second substrate or interposer 14 comprises an upper surface 22 with a semiconductor die or chip 24 disposed thereon. The die 24 has an integrated circuit (IC) formed in an active surface thereof using well known IC fabrication techniques. The die 24 can comprise, for example, a so-called "flip chip" or "controlled collapse chip connection" ("C4") IC package that is electroconductively coupled by means of, e.g., a plurality of reflow-soldered solder bumps 26, to corresponding electroconductive pads formed in a redistribution layer (RDL) 28, which can be disposed on one, the other, or both of the upper and/or a lower surface 22, 30 of the interposer 14, or alternatively or additionally, partially or completely disposed within the thickness of the interposer 14.

In the particular example embodiment of FIG. 1, the electroconductive pads and traces of the RDL 28 are electroconductively coupled to solder balls or bumps 32 disposed on electroconductive pads disposed on the lower surface 30 of the interposer 14 by means of a plurality of corresponding Vertical Interconnect Access connections, or "vias" 34, comprising vertical apertures through the interposer 14 that are subsequently metalized internally and/or filled with a metal using well-known photolithography techniques.

The solder bumps 32 can be used to mount the IC packages 10 and electroconductively connect the ICs of the dies 24 therein to, for example, the conductive traces of an underlying printed circuit board (PCB—not illustrated) in a conventional IC package mounting arrangement. In addition, selected conductive traces within the RDL 28 can be coupled to electroconductive pads 36 disposed on the upper surface 22 of the interposer 14, which can be used, for example, as contact pads for the application of, e.g., test probes for testing the functionality of the IC dies 24. Of course, other known electroconductive coupling and mounting mechanisms, such as pin grid arrays (PGAs) and corresponding sockets, can be used both to couple and mount the IC dies 24 to the inter poser 14, and/or to couple and mount the interposer 14 to an associated PCB (not illustrated.)

The first substrate or handle wafer 12 and the second substrate or interposer 14 can each be made of a variety of suitable materials, including a semiconductor material, such as silicon (Si), germanium (Ge), and gallium arsenide (GaAs), many types of glass or ceramics, many types of polymers, such as epoxy, or a "composite" material, which if desired, can be reinforced with fibers, such as fiberglass.

The "sandwiching" of the IC package 10 is effected during the fabrication of the package by bonding a lower surface 38 of the handle wafer 12 to the upper surface 22 of the interposer 14. This can be effected in a variety of ways, including adhesive bonding and by making metal-to-metal bonds that are achieved by compressing the handle wafer 12 and the interposer 14 together under relatively large forces and at relatively high temperatures.

As discussed above, in some cases, it is desirable to fabricate discrete electrical components, for example, capacitors, on or within the interposer 14, i.e., on its upper surface 22 or within a recess disposed therein. For example, a conventional "two-dimensional" (2D) metal-insulator-metal (MIM) capacitor can be formed on the upper surface of the interposer 14 by disposing alternating layers of a suitable metal and a dielectric material thereon and electroconductively coupling the metal layers to conductive pads to define the electrodes or plates of the capacitor. A similar arrangement can be effected in a "blind" trench or recess formed in the upper surface 22 of the interposer 14, and such capacitors are sometimes referred to "2D" capacitors because, all other factors being equal, their capacitance is generally a function of the area of their MIM layers, i.e., their length times their width.

Similarly, so-called "3D" capacitors can be fabricated on or in the interposer 14 by including a third dimension, viz., height, in the definition of the capacitors by constructing one or more upstanding structures, such as "rods" or "ridges," on the upper surface 22 of the interposer 14, or alternatively, on the floor of a recess disposed therein, then disposing the alternating MIM layers over the surfaces of the upstanding structures as above. All other factors being equal, the capacitance of such 3D capacitors is a function of their length times their width times their height. That is, the upstanding structures upon which the MIM layers are disposed serve to substantially increase the area of the layers, and hence, the capacitance of such devices, relative to those of 2D capacitors.

However, as can be seen in FIG. 1, the areas on the upper surface 22 of the interposer 14 upon which electrical components, such as the capacitors described above, can be fabricated, are substantially limited, due at least in part to the presence of the handle wafer 12. Thus, while handle wafers with cavities are a good approach for die 24 protection and thin interposer wafer 12 support and handling, it can be seen that the first regions 16 of the handle wafer 12, sometimes referred to as "pedestals" or "pillars," must be both high enough to clear the height of the IC dies or packages 24 disposed within the cavities 20, and wide enough to support the interposer wafer 12 adequately during a wafer thinning process, e.g., a CMP process. Further, when the interposer 14 is made relatively thin, e.g., on the order of 50 µm thick, even 3D capacitors that are embedded inside the interposer 14 will be limited in terms of the maximum capacitance obtainable in them because the thinness of the interposer 14 limits the height of the vertical structures described above, and hence, the surface area of the MIM layers of the capacitors.

It has been discovered that it is both feasible and advantageous to fabricate discrete electrical components, e.g., resistors, inductors, light emitting diodes (LEADS), detectors, sensors, actuators, microelectromechanical (MEMS) devices, and particularly, the capacitors described above, in the otherwise "wasted" volume of the first regions 16 of the handle wafer 12, and then electroconductively coupling them to, e.g., the RDL 28 of the interposer 14 during the bonding of the two wafers.

An example embodiment of an integrated circuit package 100 incorporating a plurality of capacitors 140 in the first regions 116 of a handle wafer 112 is illustrated in the vertical cross-sectional view of FIG. 2. As can be seen in a comparison of FIGS. 1 and 2, the particular example IC package 100 of FIG. 2 includes many of the same features of the IC package 10 of FIG. 1, including a first substrate, or handle wafer 112, and a second substrate, or interposer 114.

The particular handle wafer 112 illustrated in FIG. 2 includes, as in the embodiment of FIG. 1 above, three first regions 116, two second regions 118 and two corresponding cavities 120. However, as also noted above, it should be understood that the handle wafer 112 can include any practical number of first regions 116 and associated second regions 118 and cavities 120 for housing one or more IC packages or dies 124.

The example second substrate or interposer 114 comprises an upper surface 122 with two semiconductor dies, chips or packages 124 disposed thereon, and as above, the dies 124 each have at least one IC formed in a surface thereof. The example interposer 114 also includes an RDL 128, to which the dies 124 are variously electroconductively coupled, and which, in turn, is electroconductively interconnected to solder bumps 132 disposed on the lower surface 130 of the interposer 114 by corresponding vias 134, and/or to electroconductive pads 136 disposed on the upper surface 122 of the interposer 114 by conductive traces of the RDL 128.

As above, during fabrication, the lower surface 138 of the handle wafer 112 is bonded to the upper surface 122 of the interposer 114 such that the dies 124 are disposed below or within corresponding ones of the cavities 120. However, in the example IC package 100 of FIG. 2, before this bonding takes place, as discussed above, at least one electrical component, viz., a MIM capacitor 140, is formed in the otherwise wasted volume of at least one of the first regions 116 of the handle wafer 112.

In one possible embodiment, the forming of the capacitor 140 can begin with making a recess 142 having an interior surface in the lower surface 138 of a selected one of the first regions 116 of the handle wafer 112. As discussed above, in some embodiments, the recess 142 can be made to include at least one vertical structure, e.g., an upstanding rod or ridge 144, or alternatively, an array of such rods or ridges 144, formed on the floor of the recess 142 in order to substantially increase the area of the MIM layers of the capacitor 140. The rods or ridges 144 can have a relatively high aspect ratio, and can have, e.g., rectangular horizontal cross-sections. In some embodiments, the recess 142 and the rods or ridges 144 can be made simultaneously by patterning the lower surface 138 of the selected first region 116 and then etching the recess 142, together with the upstanding rods or ridges 144 therein, into the lower surface of the first region 116 using well-known photolithography techniques.

A first electroconductive layer is then created on or in the interior surface of the recess 142, including on or in the upstanding rods or ridges 144, to define a first electrode or plate of the capacitor 140. In the case of a handle wafer 112 made of a semiconductor, such as silicon (Si), the first electroconductive layer 144 can be created by doping the entire first region 116 within which the recess is formed with an appropriate dopant. For example, if the handle wafer 112 comprises monocrystalline or lightly p-doped silicon, then the entire selected first region 116 can be doped with an n-type dopant to render it, and hence, the interior surface of the recess 142 and the upstanding rods or ridges 144 therein, electrically conductive. Alternatively, only a thin layer of doped material can be formed in the respective surfaces of the interior of the recess 142 and the upstanding rods or ridges 144 to render them electrically conductive, and thereby form a first electrode or plate of the capacitor 140. In either case, the doping can be effected using, e.g., known diffusion doping or ion implant doping techniques.

In another possible embodiment, the first electrode of the capacitor 140 can be created by depositing a first layer of a metal on the interior surface of the recess 142 and on the surfaces of the upstanding rods or ridges 144. The metal can comprise, for example, one or more of tantalum (Ta), copper (Cu), titanium (Ti), titanium nitride (TiN), silver (Ag), gold (Au), aluminum (Al), chromium (Cr), palladium (Pd), platinum (Pt), Ruthenium (Ru), osmium (Os), and/or rhodium (Rh), and can be deposited on those surfaces using, for example, one or more of atomic layer deposition (ALD), chemical vapor deposition (CVD), electroless plating and/or sputtering techniques.

After the first electroconductive layer, i.e., the first electrode or plate 144 of the capacitor 140, is created, its entire surface is coated with a layer 146 of a dielectric material, to form the "I," or "insulator," of the MIM capacitor 140. The dielectric layer 146 can comprise, for example, Parylene, silicon oxide ($SiO_2$), hafnium oxide ($HfO_2$), tantalum pentoxide (Ta$_2$O$_5$), zirconium dioxide (ZrO$_2$), yttrium oxide (Y$_2$O$_3$), lanthanum oxide (La$_2$O$_3$), titanium dioxide (TiO$_2$), or strontium titanate (SrTiO$_3$), and can be deposited in a layer on the first electrode or plate 144 by atomic layer deposition (ALD), chemical vapor deposition (CVD), electroless plating and/or sputtering techniques.

The MIM "sandwich" of the capacitor 140 is completed by depositing a second electroconductive layer 148 on the surface of the dielectric layer 146. The second electroconductive layer 148 comprises a second electrode or plate of the capacitor 140, and like the first electroconductive layer 144, can comprise a metal, such as tantalum (Ta), copper (Cu), titanium (Ti), titanium nitride (TiN), silver (Ag), gold (Au), aluminum (Al), chromium (Cr), palladium (Pd), platinum (Pt), Ruthenium (Ru), osmium (Os), and/or rhodium (Rh), and can be deposited on the surface of the dielectric layer 146 using, for example, atomic layer deposition (ALD), chemical vapor deposition (CVD), electroless plating and/or sputtering techniques.

As those of some skill will understand, the MIM "sandwich" of the capacitor 140 is not limited to one insulator layer 146 and two electroconductive layers 144, 148, but rather, can have multiple alternating dielectric and electroconductive layers that serve to increase the capacitance of the capacitor 140. As a practical matter, the number of these additional alternating layers depends mainly on the spacing between, or "pitch," of the upstanding rods or ridges 144 in the recess 142.

In most applications, it is desirable to electroconductively couple each of the electrodes or plates 144, 148 of the capacitor 140 to a corresponding electroconductive pad that is disposed on the lower surface 138 of the handle wafer 112 such that, when the handle wafer 112 is bonded to the interposer 114, each of the pads is simultaneously electroconductively bonded to a corresponding electroconductive pad in the RDL 128 of the interposer 114, thereby electrically coupling the capacitor 140 to one or more circuits, such as the ICs of the semiconductor dies 124, that are also electroconductively coupled to the RDL 128. For example, the electroconductive pads of the capacitor 140 on the lower surface 138 of the handle wafer 112 and the corresponding pads on the upper surface 122 of the interposer 114 can confected of or plated with the same metal, for example, aluminum (AL), gold (Au) or copper (Cu), such that, when the handle wafer 112 is bonded to the interposer 114 at elevated temperatures and pressures, the electroconductive pads of the capacitor 140 are electroconductively coupled to the corresponding pads of the interposer 114 in an aluminum-to-aluminum (AL-to-AL), a gold-to-gold (Au-Au), or a copper-to-copper (Cu-Cu) metal bond.

However, in some embodiments, it may be desirable to electroconductively couple at least one of the electrodes or plates 144, 148 of the capacitor 140 to an upper surface 150 of the handle wafer 112, there to participate in, for example, a "stacking" arrangement of the type discussed in more detail below.

In the particular example embodiment of FIG. 2, it can be seen that the entire lower surface of the second electroconductive layer 148 defining an electrode or plate of the capacitor 140 comprises an electroconductive pad 152 disposed on the lower surface 138 of the handle wafer 112, whereas, the first electroconductive layer 144, comprising the second electrode or plate of the capacitor 140, is electroconductively coupled to an electroconductive pad 154 disposed on the upper surface 150 of the handle wafer 112, by means of an electroconductive via 156 of the type discussed above, formed through the upper surface 150 of the handle wafer 112.

In some embodiments, a "headspace" or empty volume 158 can be defined between the interior surfaces of the cavities 120 and the exterior surfaces of the semiconductor dies or die packages 124 when they are disposed therein. As illustrated in FIG. 2, in some embodiments, it might be desirable to fill these volumes 158 with an appropriate filler, such as an epoxy or a thermal interface material, to reinforce the mounting of the dies or die packages 124 within the IC package 100 and/or to provide an enhanced heat transfer path between the dies or packages 124 to the ambient surrounding the package 10. As illustrated in FIG. 2, in one possible embodiment, this can be effected by forming one or more channels 160 in the handle wafer 112 that communicate between the volume 158 and an exterior surface of the handle wafer 112, e.g., the upper surface 150 thereof, and then injecting the filler into the volume 158 through the channels 160. Similar channels may additionally or alternatively extend between adjacent cavities or between cavities and side edges of the handle wafer to accommodate material flow.

Figure 3:
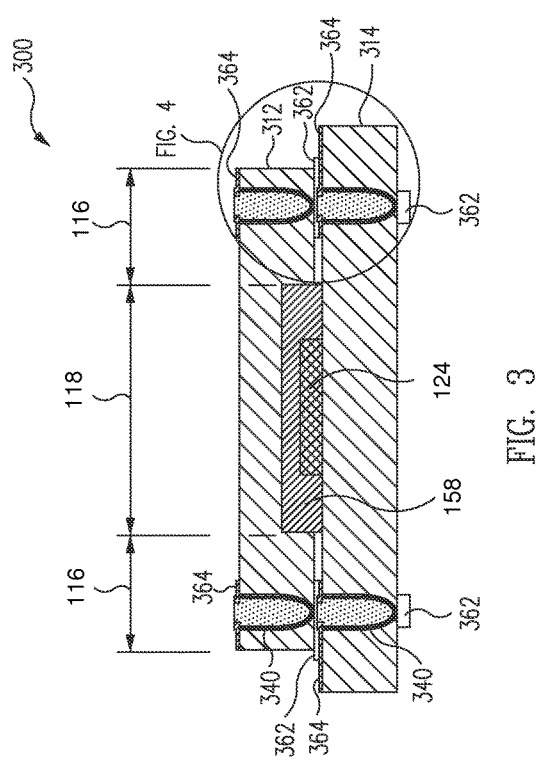
FIG. 3. is vertical cross-sectional view of another example embodiment of an integrated circuit package in accordance with the present invention; and, FIG. 4 is an enlarged breakout view of the encircled portion of the integrated circuit package of FIG. 3.

As illustrated in FIGS. 3 and 4, in some embodiments, it may be desirable to form capacitors 340 in both the first substrate or handle wafer 312 and the second substrate or interposer 314, and then electroconductively couple them to each other in a stacked arrangement during the wafer bonding operation described above.

In the example IC package 300 of FIGS. 3 and 4, the capacitors 340 can each comprise a MIM "via" or "trench" capacitor 340 of a type described in, e.g., U.S. Pat. No. 6,613,672 to T. Wang, et al. For reasons discussed below, these preferably include a Through Silicon Via (TSV) or trench formed in the respective substrates 312, 314 that includes an interior surface within or upon which a first electroconductive layer 344, comprising a first electrode or plate of the capacitor 340, is formed. As above, the first electroconductive layer 344 can comprise an appropriately doped semiconductor layer formed in the interior surface of the via or trench, or alternatively, can comprise a layer of a metal that is deposited on that surface.

As above, an "I" or dielectric layer 346 can be formed over the interior surface of the first electroconductive layer 344, and the hollow space inside the dielectric layer 346 can then be filled with, e.g., a copper (Cu) filling to form a second electroconductive "layer" 348 comprising a second electrode or plate of the capacitor 340.

In a manner similar to that of the IC package 100 of FIG. 2, the first electroconductive layer 344 or electrode of the capacitor 340 is exposed through an opening in the lower surface of the associated substrate 312 or 314 and electroconductively coupled to a corresponding electroconductive pad 362 disposed thereon, whereas, the second electrode or plate 348 of the capacitor 340, i.e., the copper filling, is electroconductively coupled to an electroconductive pad 364 disposed on an upper surface of the associated substrate 312 or 314. Additionally, the respective capacitors 340 of the associated substrates 312 and 314 can be located within their respective substrates such that, when the first and second substrates 312 and 314 are bonded to each other in a metal-to-metal bond, the capacitors 340 of the first substrate 312 will be disposed above and in a stacked alignment with corresponding ones of the capacitors 340 of the second substrate 314, as illustrated in FIGS. 3 and 4, and moreover, the first electrodes or plates 344 of the capacitors 340 of the first substrate 312 will be electroconductively coupled to respective ones of the second electrodes or plates 348 of corresponding ones of the capacitors 340 of the second substrate 314 in a metal-to-metal bond, as described above.

In light of the foregoing detailed description, it should be clear to those of some skill in this art that many modifications, substitutions and variations can be made in and to the methods and materials of the IC packages of the present disclosure, and accordingly, that the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An integrated circuit package comprising a first substrate and a second substrate bonded to the first substrate, with a plurality of cavities enclosed by the first and second substrates, the plurality of cavities comprising one or more first cavities and one or more second cavities;
   wherein the second substrate comprises circuitry with first electroconductive pads in the first and second cavities, each of the first and second cavities having at least one first electroconductive pad therein; and
   wherein the integrated circuit package further comprises:
   in each first cavity, at least one semiconductor die comprising an integrated circuit electroconductively coupled to at least one first electroconductive pad in the first cavity; and
   in each second cavity, at least one discrete electrical component electroconductively coupled to at least one first electroconductive pad in the second cavity and comprising a conductive layer such that at least one of the following is true:
   (i) the conductive layer is formed over a surface of the first substrate in the second cavity;
   (ii) the conductive layer comprises at least a part of the surface of the first substrate in the second cavity.

2. The integrated circuit package of claim 1 wherein the first substrate is a semiconductor substrate, and in at least one second cavity the conductive layer is a doped layer comprising at least said part of the surface of the first substrate.

3. The integrated circuit package of claim 1 wherein in at least one second cavity the conductive layer is formed over the surface of the first substrate.

4. The integrated circuit package of claim 1 wherein in at least one second cavity, at least one discrete electrical component is a capacitor, and the conductive layer is a first plate of the capacitor.

5. The integrated circuit package of claim 4 wherein in said at least one second cavity, the surface of the first substrate in the cavity comprises one or more rods or ridges increasing a capacitance of the capacitor.

6. The integrated circuit package of claim 5 wherein in said at least one second cavity:
   the capacitor comprises a second plate and a dielectric layer between the first and second plates; and
   the surface of the first substrate in the cavity comprises one or more rods or ridges increasing an area of each of the first and second plates.

7. The integrated circuit package of claim 4 wherein in at least one second cavity:
   the capacitor comprises a second plate and a dielectric layer between the first and second plates; and
   the surface of the first substrate in the cavity comprises one or more rods or ridges increasing an area of each of the first and second plates.

8. The integrated circuit package of claim 1 wherein the circuitry of the second substrate further comprises a second electroconductive pad not covered by the first substrate and comprises a conductive line connecting the second electroconductive pad to at least one first electroconductive pad in a second cavity.

9. The integrated circuit package of claim 1 wherein the circuitry of the second substrate comprises an electroconductive via connected to at least one first electroconductive pad and passing through the second substrate.

10. The integrated circuit package of claim 1 wherein at least one second cavity does not contain any integrated circuit.

11. A fabrication method comprising:
    obtaining a first substrate;
    forming one or more features each of which comprises a conductive layer such that at least one of the following is true:
    (i) the conductive layer is formed over a surface of the first substrate;
    (ii) the conductive layer comprises a part of the surface of the first substrate;
    providing a second substrate comprising circuitry comprising one or more first electroconductive pads;
    obtaining one or more semiconductor dies each of which comprises an integrated circuit;
    attaching together the first substrate, the second substrate, and the one or more semiconductor dies to obtain a structure with a plurality of cavities enclosed by the first and second substrates, the plurality of cavities comprising one or more first cavities and one or more second cavities, each of the first and second cavities having at least one first electroconductive pad therein, such that each first cavity contains at least one said semiconductor die comprising the integrated circuit electroconductively coupled to at least one first electroconductive pad in the first cavity, and each second cavity contains at least one discrete electrical component comprising at least one said feature and electroconductively coupled to at least one first electroconductive pad in the first cavity.

12. A fabrication method comprising:
    obtaining a first substrate;
    forming one or more features each of which comprises a conductive layer such that at least one of the following is true:
    (i) the conductive layer is formed over a surface of the first substrate;
    (ii) the conductive layer comprises a part of the surface of the first substrate;
    providing a second substrate comprising circuitry comprising one or more first electroconductive pads;
    obtaining one or more semiconductor dies each of which comprises an integrated circuit;
    attaching together the first substrate, the second substrate, and the one or more semiconductor dies to obtain a structure with a plurality of cavities enclosed by the first and second substrates, the plurality of cavities comprising one or more first cavities and one or more second cavities, each of the first and second cavities having at least one first electroconductive pad therein, such that each first cavity contains at least one said semiconductor die comprising the integrated circuit electroconductively coupled to at least one first electroconductive pad in the first cavity, and each second cavity contains at least one discrete electrical component comprising at least one said feature and electroconductively coupled to at least one first electroconductive pad in the second cavity;

wherein in at least one second cavity, at least one discrete electrical component is a capacitor, and the conductive layer is a first plate of the capacitor.

13. The method of claim 12 wherein the first substrate is a semiconductor substrate, and in at least one said discrete electrical component at least one said feature comprises a doped part of the surface of the first substrate.

14. The method of claim 13 wherein in at least one said feature of at least one said discrete electrical component, the conductive layer is formed over the surface of the first substrate.

15. The method of claim 12 wherein in said at least one second cavity, the surface of the first substrate in the cavity comprises one or more rods or ridges increasing a capacitance of the capacitor.

16. The method of claim 12 wherein in said at least one second cavity, the capacitor comprises a second plate and a dielectric layer between the first and second plates; and
the surface of the first substrate in the cavity comprises one or more rods or ridges increasing an area of each of the first and second plates.

17. The method of claim 12 wherein in said at least one second cavity, the capacitor comprises a second plate and a dielectric layer between the first and second plates; and
the surface of the first substrate in the cavity comprises one or more rods or ridges increasing an area of each of the first and second plates.

18. A fabrication method comprising:
obtaining a first substrate;
forming one or more features each of which comprises a conductive layer such that at least one of the following is true:
(i) the conductive layer is formed over a surface of the first substrate;
(ii) the conductive layer comprises a part of the surface of the first substrate;
providing a second substrate comprising circuitry comprising one or more first electroconductive pads;
obtaining one or more semiconductor dies each of which comprises an integrated circuit;
attaching together the first substrate, the second substrate, and the one or more semiconductor dies to obtain a structure with a plurality of cavities enclosed by the first and second substrates, the plurality of cavities comprising one or more first cavities and one or more second cavities, each of the first and second cavities having at least one first electroconductive pad therein, such that each first cavity contains at least one said semiconductor die comprising the integrated circuit electroconductively coupled to at least one first electroconductive pad in the first cavity, and each second cavity contains at least one discrete electrical component comprising at least one said feature and electroconductively coupled to at least one first electroconductive pad in the second cavity;
wherein the circuitry of the second substrate further comprises a second electroconductive pad not covered by the first substrate and comprises a conductive line connecting the first electroconductive pad to at least one first electroconductive pad in a second cavity.

19. The method of claim 18 wherein the circuitry of the second substrate comprises an electroconductive via connected to at least one first electroconductive pad and passing through the second substrate.

20. The method of claim 18 wherein after said attaching, at least one second cavity does not contain any integrated circuit.

* * * * *

UNITED STATES PATENT AND TRADEMARK OFFICE
CERTIFICATE OF CORRECTION

PATENT NO. : 9,831,302 B2
APPLICATION NO. : 15/360121
DATED : November 28, 2017
INVENTOR(S) : Hong Shen et al.

It is certified that error appears in the above-identified patent and that said Letters Patent is hereby corrected as shown below:

In the Specification

In Column 5, Line 37, replace "(LEADS)" with -- (LEDs) --

In the Claims

In Column 11, Line 10, Claim 14, change "13" to -- 12 --

Signed and Sealed this
Twenty-seventh Day of February, 2018

Andrei Iancu
*Director of the United States Patent and Trademark Office*